United States Patent
Chan et al.

(10) Patent No.: US 7,859,060 B2
(45) Date of Patent: Dec. 28, 2010

(54) ULTRA THIN SILICON ON INSULATOR

(75) Inventors: Kevin K. Chan, Staten Island, NY (US); Jakub Kedzierski, Lexington, MA (US); Raymond M. Sicina, Flordia, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/535,398

(22) Filed: Aug. 4, 2009

(65) Prior Publication Data

US 2009/0289303 A1    Nov. 26, 2009

Related U.S. Application Data

(62) Division of application No. 12/042,936, filed on Mar. 5, 2008, now Pat. No. 7,816,224.

(51) Int. Cl.
*H01L 29/94*    (2006.01)

(52) U.S. Cl. .......... 257/369; 257/347; 257/E21.43; 257/E21.75; 438/300; 438/763

(58) Field of Classification Search ............. 257/347, 257/369; 438/300, 763
See application file for complete search history.

(56) References Cited

U.S. PATENT DOCUMENTS

| | | | | |
|---|---|---|---|---|
| 5,973,363 | A * | 10/1999 | Staab et al. | 257/347 |
| 7,468,311 | B2 | 12/2008 | Dip et al. | |
| 2005/0218395 | A1 | 10/2005 | Kim et al. | |

* cited by examiner

*Primary Examiner*—Dung A. Le

(57) ABSTRACT

In one embodiment, the invention is a method and apparatus for fabricating an ultra thin silicon on insulator. One embodiment of a method for fabricating an ultra thin silicon on insulator includes providing a silicon layer, saturating the silicon layer with at least one reactant gas at a first temperature, the first temperature being low enough to substantially prevent the occurrence of any reactions involving the reactant gas, and raising the first temperature to a second temperature, the second temperature being approximately a dissociation temperature of the reactant gas.

10 Claims, 2 Drawing Sheets

ULTRA THIN SILICON ON INSULATOR

CROSS REFERENCE TO RELATED APPLICATIONS

This application is a divisional application of co-pending U.S. patent application Ser. No. 12/042,936, filed Mar. 5, 2008, which is herein incorporated by reference in its entirety.

BACKGROUND OF THE INVENTION

The present invention relates generally to high-performance transistors, and relates more particularly to the fabrication of ultra thin silicon on insulators.

Ultra thin silicon on insulator (UTSOI) refers to SOIs having an extremely thin layer of silicon (e.g., forty to eighty Angstroms) deposited on a silicon dioxide ($SiO_2$) buried oxide (BOX) layer. UTSOI is often used in the fabrication of high-performance transistors.

Due to the extreme thinness of the silicon layer, contact resistance becomes a critical issue. Attempts to reduce contact resistance have included raising the source and drain of the UTSOI, for instance using selective epitaxial silicon or silicon germanide (SiGe) growth. The temperature of the epitaxial growth in such processes is a critical parameter for proper employment of the raised source and drain technique. For instance, if the temperature is too high (e.g. approximately 800 degrees Celsius or above) the thin silicon layer becomes agglomerated and uneven, resulting in greatly increased contact resistance. However, if the temperature is too low (e.g., less than approximately 750 degrees Celsius), selectivity and growth rate prevent good formation of the raised source and drain.

Thus, there is a need in the art for a method and apparatus for fabricating an ultra thin silicon on insulator to reduce contact resistance.

SUMMARY OF THE INVENTION

In one embodiment, the invention is a method and apparatus for fabricating an ultra thin silicon on insulator. One embodiment of a method for fabricating an ultra thin silicon on insulator includes providing a silicon layer, saturating the silicon layer with at least one reactant gas at a first temperature, the first temperature being low enough to substantially prevent the occurrence of any reactions involving the reactant gas, and raising the first temperature to a second temperature, the second temperature being approximately a dissociation temperature of the reactant gas.

BRIEF DESCRIPTION OF THE DRAWINGS

So that the manner in which the above recited features of the present invention can be understood in detail, a more particular description of the invention, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In one embodiment, the present invention is a method and apparatus for fabricating an ultra thin silicon on insulator. Embodiments of the invention grow a selective epitaxial silicon (Si) or silicon germanide (SiGe) alloy at a moderate high temperature, resulting in a raised source and drain region with selectivity, high growth rate, and excellent silicon quality. More importantly, the occurrence of silicon agglomeration is greatly reduced.

Figure 1:
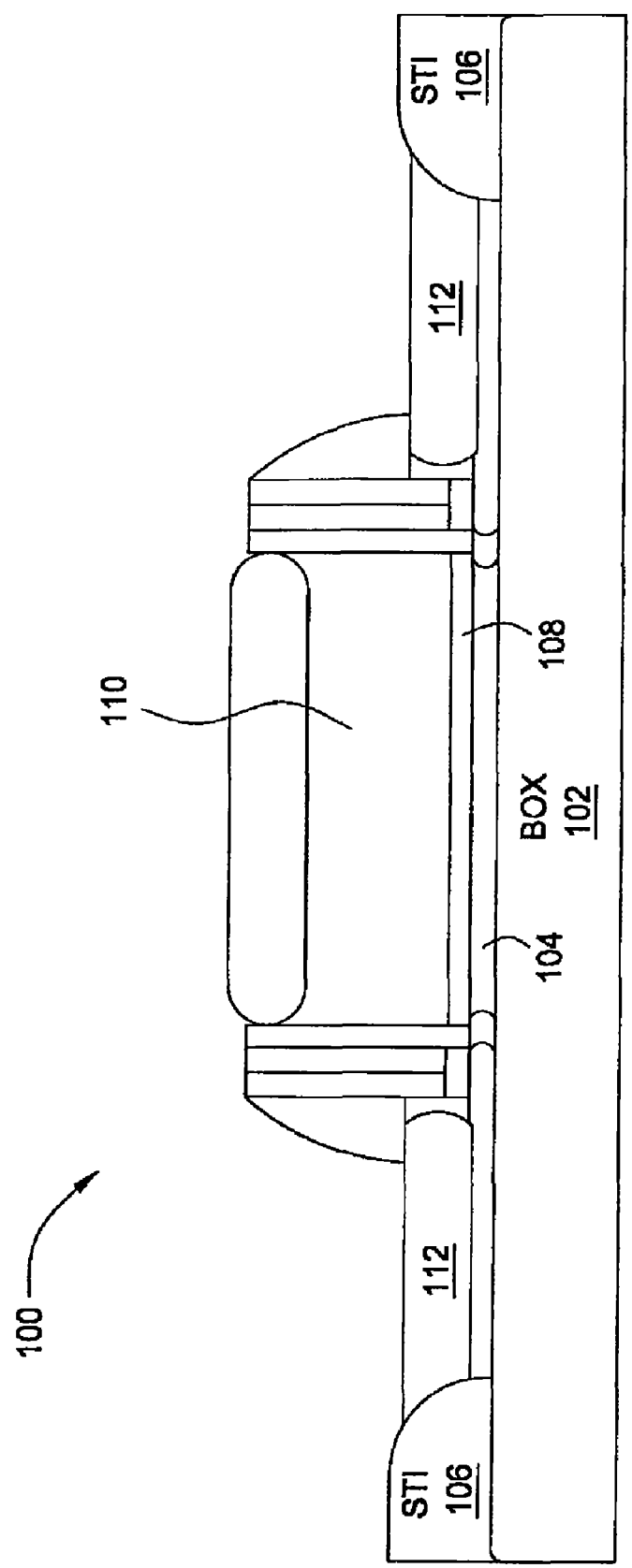
FIG. 1 is a schematic diagram illustrating an exemplary field effect transistor component of a complementary metal-oxide-semiconductor device, fabricated in accordance with the present invention.

FIG. 1 is a schematic diagram illustrating an exemplary field effect transistor (FET) component 100 of a complementary metal-oxide-semiconductor (CMOS) device, fabricated in accordance with the present invention. The FET 100 may be an n-type FET (nFET) or a p-type FET (pFET).

The FET 100 comprises a buried oxide (BOX) layer 102 upon which a thin silicon layer 104 and a shallow trench isolation (STI) region 106 are formed. A gate dielectric 108 is formed over at least a portion of the silicon layer 104, and a gate area 110 is formed over the gate dielectric 108. The gate dielectric 108 provides a conductive barrier between the gate area 110 and a raised source/drain region 112 (where the source/drain region 112 is raised with respect to the silicon layer 104).

Figure 2:
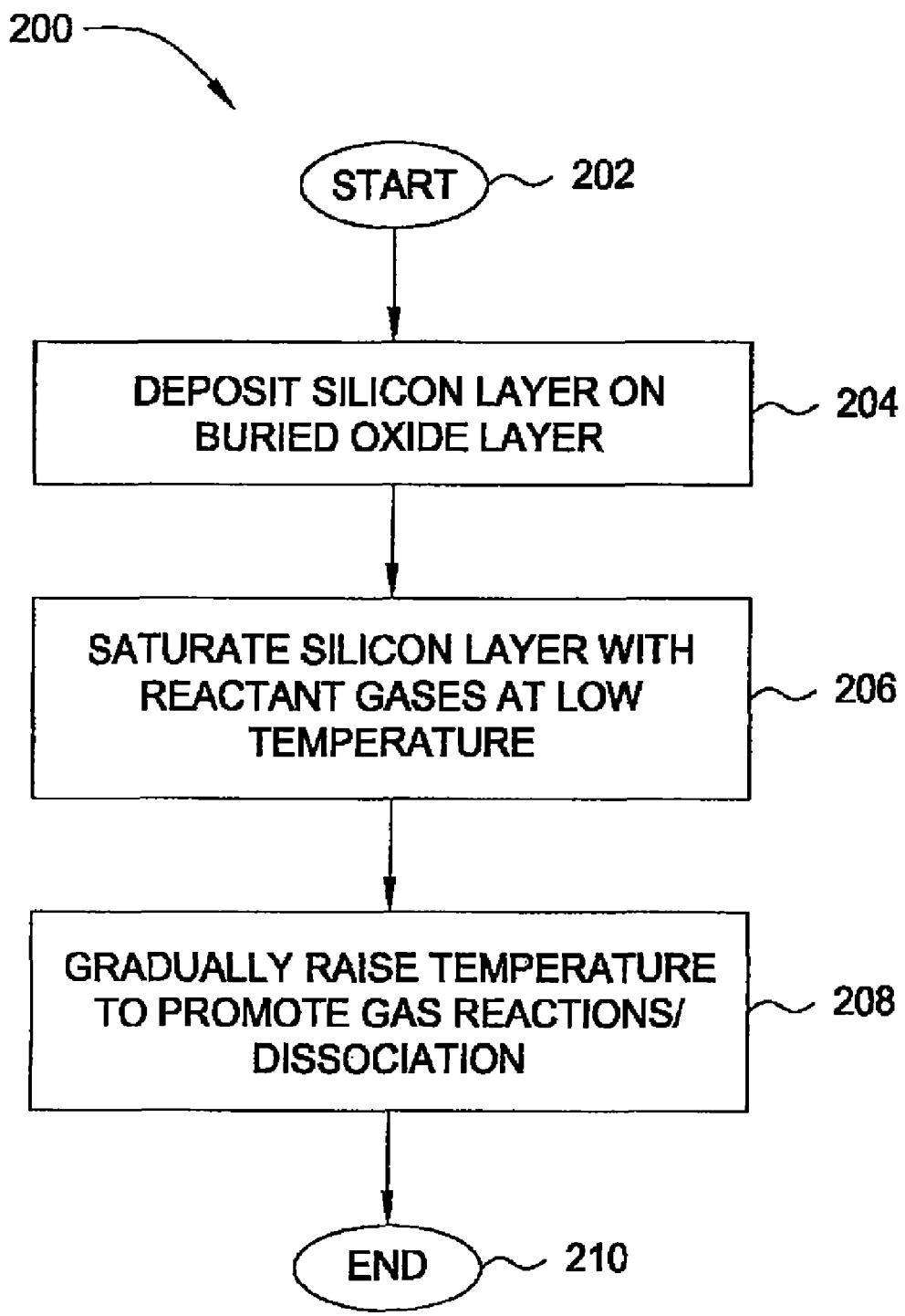
FIG. 2 is a flow diagram illustrating one embodiment of a method for fabricating an ultra thin silicon on insulator, according to the present invention.

FIG. 2 is a flow diagram illustrating one embodiment of a method 200 for fabricating an ultra thin silicon on insulator, according to the present invention. The method 200 may be implemented, for example, to fabricate the FET illustrated in FIG. 1.

The method 200 is initialized at step 202 and proceeds to step 204, where the method 200 deposits a thin layer of silicon on a buried oxide layer. In one embodiment, the buried oxide layer comprises silicon dioxide ($SiO_2$). In one embodiment, the layer of silicon has an initial thickness in the range of approximately forty to approximately eighty Angstroms.

In step 206, the method 200 saturates the silicon layer with reactant gases at a low temperature. In one embodiment, the reactant gases comprise at least one of: dichlorosilane ($SiH_2Cl_2$), hydrochloric acid (HCl), silane, and a silane compound. In one embodiment, a "low" temperature for the purposes of step 206 is a temperature that is low enough to substantially prevent the occurrence of any reactions involving the reactant gases (e.g., approximately 400 degrees Celsius).

In step 208, the method 200 gradually raises the temperature. As the reactant gases reach their dissociation temperatures (e.g., approximately 650 degrees Celsius), the reactant gases will react and form selective epitaxial silicon on the silicon layer. This selective epitaxial layer forms a raised source and drain region on the silicon layer. For example, the dissociation bonding energy of dichlorosilane is approximately 105 Kcal/mole and the dissociation bonding energy of hydrochloric acid is approximately 103 Kcal/mole. Thus, in the case where both dichlorosilane and hydrochloric acid are used as reactant gases, the reactant gases will dissociate substantially simultaneously to form radicals and to react to the surface of the silicon layer. The method 200 then terminates in step 210.

Because the thin epitaxial silicon forms on the silicon layer (which is no longer as thin as when the method 200 started), silicon agglomeration is substantially prevented. In one embodiment, the combined thickness of the silicon layer and the epitaxial silicon is approximately five to approximately thirty nanometers.

While the foregoing is directed to embodiments of the present invention, other and further embodiments of the invention may be devised without departing from the basic scope thereof. Various embodiments presented herein, or portions thereof, may be combined to create further embodiments. Furthermore, terms such as top, side, bottom, front, back, and the like are relative or positional terms and are used with respect to the exemplary embodiments illustrated in the figures, and as such these terms may be interchangeable.

What is claimed is:

1. An ultra thin silicon on insulator, comprising:
   a silicon layer; and
   a raised source and drain region grown on the silicon layer, the raised source and drain region being grown by:
      saturating the silicon layer with at least one reactant gas at a first temperature, the first temperature being low enough to substantially prevent the occurrence of any reactions involving the at least one reactant gas; and
      raising the first temperature to a second temperature, the second temperature being approximately a dissociation temperature of the at least one reactant gas.

2. The ultra thin silicon on insulator of claim 1, wherein the raised source and drain region is formed of silicon or silicon germanide.

3. The ultra thin silicon on insulator of claim 1, wherein the at least one reactant gas comprises a plurality of reactant gases, the plurality of reactant gases having substantially similar dissociation temperatures.

4. The ultra thin silicon on insulator of claim 1, wherein the at least one reactant gas comprises at least one of: dichlorosilane, hydrochloric acid, silane, and a silane compound.

5. The ultra thin silicon on insulator of claim 1, wherein the first temperature is approximately 400 degrees Celsius.

6. The ultra thin silicon on insulator of claim 1, wherein the second temperature is approximately 650 degrees Celsius.

7. The ultra thin silicon on insulator of claim 1, wherein the silicon layer has an initial thickness prior to the saturating in the range of approximately forty to approximately eighty Angstroms.

8. The ultra thin silicon on insulator of claim 1, wherein a combined thickness of the silicon layer and the raised source and drain region is in the range of approximately five to approximately thirty nanometers.

9. A field effect transistor, comprising:
   a buried oxide layer;
   a silicon layer formed over the buried oxide layer; and
   a raised source and drain region formed on the silicon layer; the raised source and drain region being formed by:
      saturating the silicon layer with at least one reactant gas at a first temperature, the first temperature being low enough to substantially prevent the occurrence of any reactions involving the at least one reactant gas; and
      raising the first temperature to a second temperature, the second temperature being approximately a dissociation temperature of the at least one reactant gas.

10. The field effect transistor of claim 9, further comprising:
   a gate dielectric formed on at least a portion of the silicon layer; and
   a gate area formed over the gate dielectric,
   where the gate dielectric provides a conductive barrier between the gate area and the raised source and drain region.

* * * * *